United States Patent [19]

Belke, Jr. et al.

[11] Patent Number: 4,466,874
[45] Date of Patent: Aug. 21, 1984

[54] METHOD OF ELECTRODING A POLY(VINYLIDENE FLUORIDE) SOLID

[75] Inventors: Robert E. Belke, Jr.; Richard J. Hill; Raymond A. Shirk, all of N. Syracuse; David P. Smith, Clay, all of N.Y.

[73] Assignee: General Electric Company, Syracuse, N.Y.

[21] Appl. No.: 537,060

[22] Filed: Sep. 29, 1983

[51] Int. Cl.³ .............................................. C23C 15/00
[52] U.S. Cl. .......................... 204/192 EC; 204/192 R; 204/192 E; 156/625
[58] Field of Search .......... 204/192 EC, 192 R, 192 E

[56] References Cited

U.S. PATENT DOCUMENTS 3,816,198  6/1974  LaCombe et al. ............. 156/16
4,342,632  8/1982  Heim ............................ 204/192 EC
4,364,792 12/1982  Gliem et al. .................. 204/192 EC

FOREIGN PATENT DOCUMENTS 2036627  7/1980  United Kingdom ......... 204/192 EC

OTHER PUBLICATIONS

Lovinger, A. J., "Ferroelectric Polymers", Science vol. 220, No. 4602, Jun. 10, 1983 p. 1115-1121.
Shaw, H. J. et al, Stanford University, "PVF₂ Transducers" 1980 Ultrasonics Symposium, IEEE, pp. 927-940.
Roberts, A. L., Research News "Flexible PVF₂ Film: An Exceptional Polymer for Transducers", Science, vol. 200, Jun. 23, 1978, pp. 1371-1374.
Bassett, D. C., "Poly(Vinylidene Fluoride)" Developments in crystalline polymers-1, pp. 201-215-Applied Science Publishers.

Primary Examiner—Arthur P. Demers
Attorney, Agent, or Firm—Richard V. Lang; Carl W. Baker

[57] ABSTRACT

The invention deals with a method of electroding a poly(vinylidene fluoride) solid in a piezoelectric application. The electroding method entails surface preparation of the poly(vinylidene fluoride) by a variety of steps including plasma etching to create temporary molecular scale surface irregularities followed by sputtering a metallic layer before deterioration of the plasma etched surface. The chromium may be the initial metal sputtered, followed by a sputtered copper layer, followed in turn by at least one heavier electrodeposited conductive layer. The method may be conducted without deterioration of the piezoelectric properties of the material. The method has been found to provide very good adhesion between the electrode and the PVF₂ surface.

8 Claims, 2 Drawing Figures

METHOD OF ELECTRODING A POLY(VINYLIDENE FLUORIDE) SOLID

CROSS REFERENCE TO RELATED APPLICATION

This application is related to the commonly assigned application entitled "Method of Bonding a Poly (Vinylidene Fluoride) Solid to a Solid Substrate", of Robert E. Belke and Raymond A. Shirk (U.S. Pat. Application Ser. No. 537,059 filed concurrently herewith.

BACKGROUND OF THE INVENTION

This invention relates to the electroding of poly(vinylidene fluoride) and more particularly to the surface treatment of poly(vinylidene fluoride) and the selection of metallization steps for forming electrodes on the surface of the poly(vinylidene fluoride).

Poly(vinylidene fluoride) is a polymer which has been found to exhibit "piezoelectric" properties when suitably processed. The term "piezoelectric" is used herein to denote the property of a material by which the application of a mechanical stress to the material produces an electrical potential across the material. The term also connotes the converse property (which is also present to some degree) by which application of an electrical potential through the material produces a stress and resultant mechanical strain. The poly(vinylidene fluoride) material has been found to exhibit the piezoelectric property only after non-random or or crystalline molecular orientations have been created, and after polarization has occurred in respect to these oriented molecular constituents. The orientation and polarization of the poly(vinylidene fluoride) takes place at room temperature and above, and may be destroyed if care is not exerted in subsequent treatment of the material. Exposure to excessive electric fields or excessive temperature may have this effect. Given that the material has suitable piezoelectric properties for use, it is essential that the electrodes withstand exposure to pressure and provide the quality of electrical contact required. One application of this piezoelectric material is the sensing of acoustic vibrations in sea water, typified by a hydrophone.

Accordingly, it is an object of the invention to provide a novel method of electroding a poly(vinylidene fluoride) solid.

It is another object of the invention to provide a novel method of electroding a poly(vinylidene fluoride) solid in a piezoelectric application, having improved adhesion.

Another object of the invention is to provide a novel method of electroding a poly(vinylidene fluoride) solid in a piezoelectric application having improved adhesion and facilitating optimum piezoelectric properties.

These and other objects of the invention will be dealt with in the description which follows. They are achieved in a novel method of electroding a poly(vinylidene fluoride) (PVF$_2$) solid comprising the steps of abrading the surface of the PVF$_2$ solid to provide an irregular bonding surface, rinsing the surface to remove surface contaminants; plasma etching the surface by activated free radical and ionic species of oxygen, to create temporary molecular scale surface irregularities (while keeping the PVF$_2$ solid at a temperature below the melting point of its crystallites for dimensional stability or below the temperature for reversion to the unpolarized state), and sputtering a metallic layer on the prepared surface of the PVF$_2$ solid before the prepared surface has deteriorated.

In a practical embodiment, the initial sputtered metallic layer is chromium, followed by a sputtered copper layer, which is then used as the basis for electrodeposition of a more substantial copper layer. The copper layer may be the final element of the metallization, or it may be followed by an electrodeposited nickel layer, or an evaportaed gold layer. In practice, all steps in the process and in particular the plasma etching, sputter etching, and sputtering steps may be conducted at a temperature which does not adversely affect the piezoelectric properties of the poly(vinylidene fluoride).

BRIEF DESCRIPTION OF THE DRAWINGS

The novel and distinctive features of the invention are set forth in the claims appended to the present application. The invention itself, however, together with further objects and advantages thereof, may best be understood by reference to the following description and accompanying drawings, in which:

DESCRIPTION OF THE PREFERRED EMBODIMENT

The method of the present invention is applicable to the electroding of a poly(vinylidene fluoride) (PVF$_2$) solid as a step in the fabrication of a PVF$_2$ pressure wave transducer.

Figure 1:
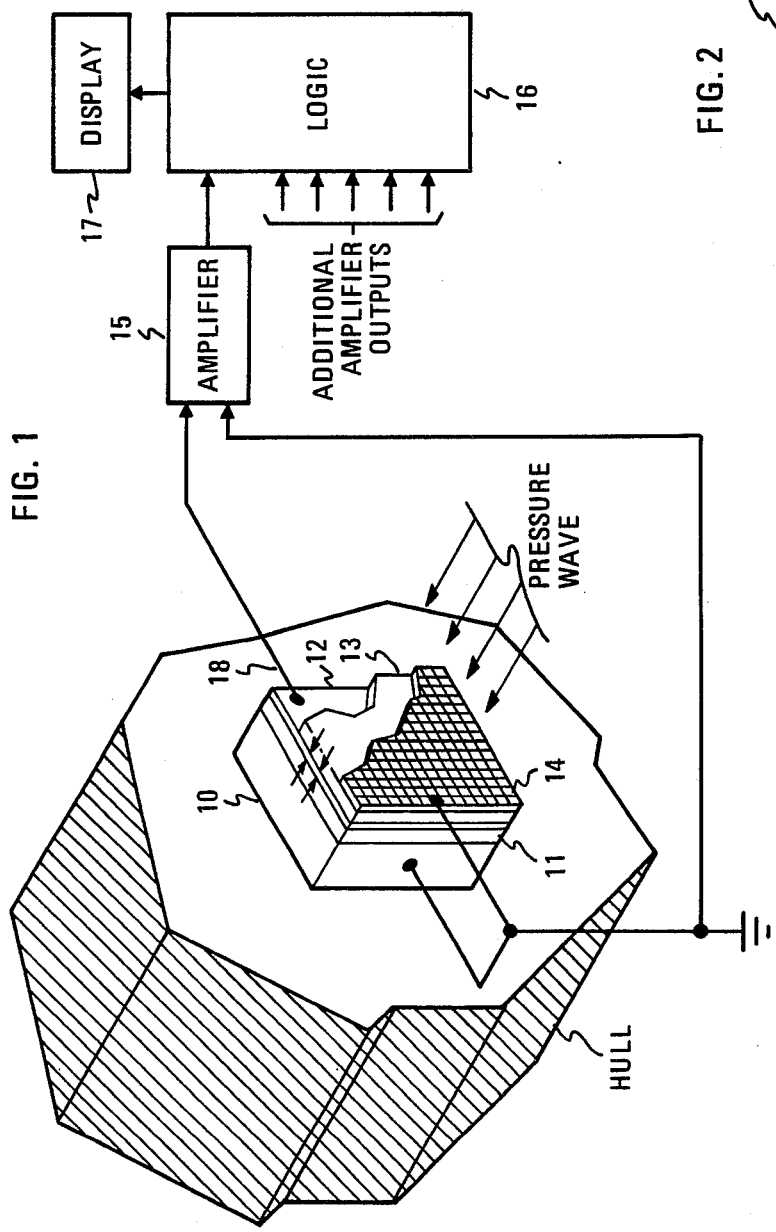
FIG. 1 is an illustration of a pressure wave transducer suitable for use as an element in an array of such elements used as a hydrophone, the transducer employing poly(vinylidene fluoride) solids having piezoelectric properties and requiring one or more surface metallizations for derivation of electrical output signals.

A PVF$_2$ pressure wave transducer is illustrated in FIG. 1, suitable for use as an element in an array of such elements used as a hydrophone. The array may consist of large numbers of relatively small (2–2½") square transducers, typically arranged conformably over a surface on the hull of a ship. The pressure wave transducer in the illustrative application (neglecting details of the electroding) consists of a metallic substrate 10, typically steel, 0.125 inches thick, a first layer 11 of PVF$_2$ attached to the steel substrate, a central electrode 12 bonded to the outer surface of the first, inner layer 11 of PVF$_2$ and to the inner surface of the outer layer 13 of PVF$_2$; the second, outer layer 13 of PVF$_2$; and an outer electrode 14 bonded to the outer surface of the outer PVF$_2$ layer. The PVF$_2$ layers 11 and 13 are typically 0.025 inches thick and are co-extensive with one another. A conductive wire 18, soldered to the central electrode, is provided for external signal connection.

The pressure wave transducer in the FIG. 1 application is designed to be attached to the hull of a ship via the substrate 10, with the two PVF$_2$ layers being on the sea water side of the substrate and subjected to the pressure waves propagating in the sea water. Due to the piezoelectric properties of the PVF$_2$ material, the application of hydraulic pressures across the PVF$_2$ layers create potential differences across the layers. When the polarization of layer 11 is inverted in respect to the polarization of layer 13, two potential differences are produced having the same sense when measured at the central electrode 12 in respect to the outermost electrode 14 and the substrate 10. In the illustrated application, the outer electrode 14 and substrate 10 are connected together and grounded, and the potential difference, which occurs as a result of the incidence of a pressure wave upon the transducer, is the signal which may be derived from the central electrode 12 in respect to ground. The output signal of the transducer is coupled to an amplifier 15, and coupled together with the outputs of similar amplifiers similarly connected to other elements of the array. The collected amplified signals are then coupled to signal processing logic 16 for display of the information on the display 17.

In the transducer application, it is essential that the $PVF_2$ layers be properly electroded on their major surfaces and that the electroding be attached in a manner that resists detachment and does not reduce the signal potential available across the $PVF_2$ layers.

The method of electroding a $PVF_2$ solid as a step in the fabrication of a transducer element of the hydrophone illustrated in FIG. 1, will be described with reference to FIG. 2, which illustrates the details of the finished electrode.

Figure 2:
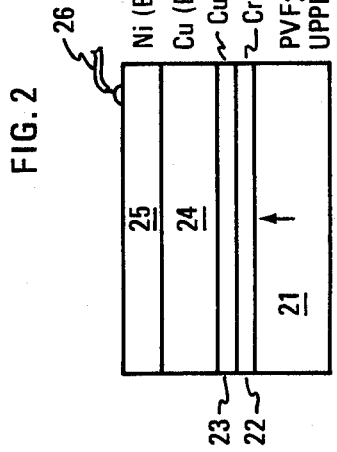
FIG. 2 is an illustration of a four layer electrode construction resulting from practice of the present method.

Referring to FIG. 2, the upper surface of the $PVF_2$ sheet 21 is the surface upon which the electrode is formed. The upper surface of the $PVF_2$ sheet must be prepared for electroding. For conventional use as the active piezoelectric material in a pressure wave transducer, the $PVF_2$ sheet 21 will have been stretched for dipole orientation and poled to exhibit the desired piezoelectric properties. As procured, the $PVF_2$ sheet has a glossy surface, which may include a mold release.

The poly(vinylidene fluoride) of interest is also available in pellet or powder form from a small number of suppliers. One supplier is the Pennwalt Corporation of New Jersey. A suitable product is labeled Kynar 460. The product must be converted from the pellet or powder form to the sheet form, the processing requiring a mold release, preferably one that is readily removed. The sheet may then be "oriented" and poled.

The processing which follows must prepare the surface of the electroding, and apply the electroding under circumstances that do not adversely affect the piezoelectric properties of the $PVF_2$ sheet.

As is well known, a $PVF_2$ solid contains crystallites of several varieties, which must retain their crystalline state for dimensional stability. While the material has a somewhat undefined "melting" point, due in part to the variability of its solid state, softening occurs at about 156° C. The stretching produces an orientation of the molecular dipoles of the material, and the poling, which proceeds with an indefinite "Curie point", can be accomplished at room temperature, or higher. The degree of poling is dependent in part on the strength and duration of the applied field and in part on the temperature (and the crystalline composition). If the material is subsequently heated above the temperature at which the material is poled, the polarization will diminish due to a relaxation within the material and the piezoelectric coupling will deteriorate. Accordingly, the electroding of the $PVF_2$, which will subsequently follow must not exceed the relaxation temperature of the polarized, oriented crystallites. Recognizing that electroding may require some elevation in temperature, polarized, available oriented materials have 50° to 120° upper processing limits.

To prepare the surface of the $PVF_2$ sheet for electroding, it may be given a first wiping and/or rinsing to removing any gross quantities of surface contaminants and the mold release. This wiping may be done with an absorbent paper or cloth, using a solvent such as acetone for rinsing.

In the event that the $PVF_2$ sheet has been processed with a silicone release, it must be rinsed first with toluene, in which the silicones are relatively soluble, followed by the abrasive removal of 2 or 3 mils of the upper surface. The surface is rinsed again with toluene to remove the last traces of silicones, and given an acetone rinse to remove the toluene. (The acetone is ordinarily adequate to remove certain other common hydrocarbon mold releases.)

After rinsing, the surface of the $PVF_2$ sheet is abraded until any gloss is removed, and the surface has a dull appearance. The abrasion is preferably performed by blasting the surface with sand or glass beads, which create random indentations into the surface at a depth and density adequate to affect the specular quality of the surface to the eye. The blasting appears to be preferable to conventional sanding, which tends to be directional, while either method of creating an irregular surface enhances the adhesion over that of a smooth surface. A suitable degree of surface roughness corresponds approximately to a 32 microinch rms finish.

After abrasion, the $PVF_2$ sheet is rinsed with a solvent to remove any remaining surface contaminants such as the mold release and finger oils. The rinsing may involve use of a polar or non-polar solvent of which there are a large number. Suitable solvents include chlorinated solvents such as 1, 1, 1 trichlor-ethylene, methylene chloride; ketones, including acetone, MIBK and MEK; alcohols; and Freon$^{TM}$ solvents, including the TMS and TMC varieties of Dupont. The solvent selection is dependent on the particular mold release employed, and on the other surface contaminants present.

The electroding is not built up from the specially prepared upper surface of the $PVF_2$ sheet 21. As illustrated in FIG. 2, the final electroding may be regarded as a four layer arrangement with successful attachment of electrodes being dependent on a high degree of adhesion between each succeeding layer. These layers, commencing with the $PVF_2$ sheet 21, include a 2KÅ layer 22 of chromium, which is applied by sputtering and which because of its excellent adhesive qualities is a preferred foundation for the electrode; a 8KÅ layer 23 of copper which is applied by sputtering and which adheres readily to the chromium and which provides a suitable base for electrodeposition of a thicker copper layer; a second electrodeposited layer of copper, electrodeposited to a thickness of 0.2 mils; and finally, a protective electrodeposited nickel layer of 0.1 mils.

A connection to the electrode (22–25) may be taken by a copper wire 26 soldered to an exposed corner of the electrode. In fabrication of the FIG. 1 hydrophone element, the central electrode 12 may in fact consist of two separate electrodes; one formed on the $PVF_2$ sheet 11 and one formed on the $PVF_2$ sheet 13, which are then electrically interconnected. One method of interconnection is to bond the two electrodes together with a conductive epoxy adhesive. Alternatively, a separate wire may be provided for connection to each of the electrodes, physical access for the solder connection being provided by notching each $PVF_2$ sheet at the same corner in an offset manner to expose a portion of each electrode supported by the $PVF_2$ sheet.

The foregoing four layer electrode construction provides strong adhesion to the $PVF_2$ sheet when processed in the following novel manner. After the surface of the PVF$_2$ sheet has been abraded and rinsed, it is plasma etched. This is done with a DC plasma in an $O_2$ atmosphere, at a pressure of 50 microns of mercury with a DC potential of from 500 to 600 volts. The etching is conducted at a current of 0.1 amperess for a period of from 1 to 5 minutes for a 2"×2" surface. The density of the resultant plasma may be controlled by adjustment of the distance between electrodes. A suitable spacing is ½ inch.

The plasma etching may be conducted with either an rf or a dc plasma. The plasma itself is developed from a low pressure source of oxygen, which under the influence of the electric fields contains activated free radical and ionic species of oxygen. These species include monomolecular oxygen, ozone (trimolecular oxygen) and ionic forms of oxygen. In addition, the etching, which is conducted for a minimum heating of the PVF$_2$ surface, produces some gaseous decomposition products of the PVF$_2$. The etching rate and duration are selected to avoid elevating the temperature of the PVF$_2$ above the temperature at which it reverts to the unpolarized state. As earlier noted, this reversion temperature is a function of the prior processing of the PVF$_2$.

The voltage, current, and pressure for the plasma etching are selected to sustain the ionic and free radicals associated with the plasma in sufficient populations to effect surface energy modification of the PVF$_2$, without gross deterioration of the surface. High plasma densities may permit faster processing, but also increase the temperature of the PVF$_2$ sample and increase the chance for a high temperature induced piezoelectric deterioration. The selection of a relatively low pressure ($\sim$50 microns of mercury) permits the surface to be suitably modified to provide a significant increase in adhesion by the electrode metallizations at a low enough power dissipation to avoid significantly attacking the material, or depoling the constituent crystallites by excessive heating. The etching rate is approximately proportional to the pressure, and applied field, and the absolute values are dependent on the equipment. A suitable dc plasma etching apparatus is disclosed in U.S. Pat. No. 3,816,198 of D.J. LaCombe.

An RF unit available from Plasmoid, Inc. is also suitable. The conditions for operating an RF plasma must also be adjusted to provide uniform etching over the surface of the PVF$_2$ while avoiding elevation of the temperature above the point at which the material reverts to the unpolarized state. The equipment may be operated at a 50 watt setting for a 2"×2" sample at a pressure of 50 microns of Hg (in an $O_2$ atmosphere). The etching is conducted for a five minute interval.

The plasma etching has been observed to enhance the adhesion of the sputtered chromium layer to the surface of the PVF$_2$ solid. The enhanced adhesion is believed to arise in the following manner. There appears to be some additional cleaning away of surface contamination. The primary effect, however, appears to be the creation of molecular scale irregularities in the PVF$_2$ surface. These surface irregularities are of a much smaller scale than is produced by the initial abrasion. The dimensional units of the PVF$_2$ crystalline sites are approximately 5 and 10 Å. The crystallographic features of PVF$_2$ have been described in *Developments in Crystalline Polymers* by D. C. Bassett, Applied Science Publishers, Inc., 1982, in Chapter 5 entitled "Poly(vinylidene fluoride)", Andrew S. Lovinger (see particularly pages 201-215). It appears that the surface irregularities created by the plasma etching are as small as these dimensions and up to at least one order larger. The estimated size of the surface irregularities produced is consistent with the fact that the plasma consists of energetic species of oxygen molecules that impact the surface of the PVF$_2$ in a random fashion for a specified period of time. This time is adjusted to be too short to effect larger scale or more uniform surface erosion. The enhancement in adhesion is believed to be due to these small scale surface irregularities which engage or trap the subsequently sputtered chromium atoms.

The improved receptivity of the PVF$_2$ surface for sputtered atoms by the plasma etching deteriorates with time. The deterioration appears to be not measurable within eight hours after discontinuance of the plasma etching. Early metallization of the plasma etched surface is advantageous. After a 24 hour period, the beneficial effect of the plasma etching appears to be significantly reduced, the surface appearing to "heal" itself. The indicated time periods above assume that the surface is not subject to contact or to air borne contamination, and that the treated surface is properly protected. Ideally, the plasma etched PVF$_2$ sheet should be stored in a vacuum between the plasma etching and the sputtering steps.

Assuming that the PVF$_2$ sheet must be processed with an interruption between the plasma etching step and the metallization step, it is conventional to clean the surface of the PVF$_2$ by "back-sputtering" or "sputter etching" as a first step in the sputtering process. This step is carried out in the sputtering apparatus with the dc potentials reversed between the target (which supplies the metallization) and the substrate (which is to be metallized). The sputter etching is carried out for a short interval (typically 3 minutes) at the normal (500 watt) RF power setting.

A suitable sputtering apparatus is a Perkin-Elmer, model 4200, RF magnetron design. Sputtering apparatus of this design uses RF energy to increase the activity of the gas ions used to bombard the target, suiting the apparatus for sputtering a wide variety of conductive and insulating targets. The magnetron structure is designed to minimize electron impingement on the substrate in order to minimize undesired sample heating. This particular apparatus has plural targets, which may be successively rotated into operating position over the sample, permitting multiple metallizations without breaking the vacuum.

The conventional procedure entails introducing the sample into the apparatus, followed by evacuation of the sputtering chamber to a pressure of $10^{-9}$ microns. After the $10^{-9}$ micron pressure has been reached, the chamber is "back filled" to a 10 micron level with argon. In the selected apparatus, a suitable dc potential is 2000 volts between target and source; and the distance is approximately 1½ inches.

During sputter etching, the substrate has a positive potential in relation to the target, and positively charged gas molecules, which are created in the fields within the apparatus, are accelerated by the dc field for impingement on the substrate. The apparatus parameters are designed to clean, and not significantly alter the plasma etched surface of the PVF$_2$ sheet. After the sputter etching has taken place, the normal polarity of sputtering potentials is applied (target negative and sample positive) and the ionized argon molecules are now accelerated toward the initial chromium target, now rotated into a position above the substrate. The sputtering of the chromium continues for about 15 minutes to achieve thicknesses of 2KÅ. Then the electrical excitation is switched to the copper target. Copper deposition continues for about 22 minutes, until the copper deposition has reached a thickness of 8KÅ, suitable as a base for electrodeposition of a more substantial conductive layer. Assuming that there is continuity in the process, the sputtering can be terminated, and the copper is placed in an electrodeposition bath. Electrodeposition may then continue until the metallization is substantial enough (e.g. 0.2 mils) for electrical contact. Ordinarily, the copper electrodeposition is not the final layer. Typically, it may then be covered by a nickel electrodeposition of 0.1 mils to protect the copper. The last nickel layer may be soldered to attach a suitable wire 26 as shown in FIG. 2.

In the event that there will be an interruption between the sputtering and the electrodeposition, it is common to apply a titanium layer to a depth of 1KÅ. This protects copper for handling and surface exposure until such time as electrodeposition can take place. Prior to electrodeposition, however, the titanium is removed by a fluoroboric acid etch. The electrodeposition steps are conventional.

One may optionally electroplate a thin gold layer on top of the nickel. Gold may be used for the central surface in the event that contact is to be made to the surface by a spring loaded contact finger. The function of the nickel layer is to provide a non-porous barrier to galvanic action or migration between the copper and the gold. A nickel surface is also suited for a contact finger connection or for a soldering connection. In may applications, the electroplated copper surface may be quite adequate and may not need further treatment.

The adhesion of the electrodes applied by the method just described is very good and suitable for many practical applications. In one test of the adhesion, a crosshatch adhesion test using a fixture similar as specified in ASTM B571 was employed. A grid is scribed on the electrode surface, with the scriber penetrating through the metallization to the $PVF_2$ substrate to separate the metallization into small areas. The grid is then pulled with an adhesive tape having a strength exceeding 40 oz. per square inch. The adhesive tape produced no observable removal of metallization.

A second, more stringent adhesive test (per mil STD 1376), produced an observed average load of 5 lbs. for destruction of a solder bond to a number 16 copper wire bonded normal to the $PVF_2$ surface.

A second electrode adhesion test involves the use of a 30 gauge wire consisting of 7 strands of 0.004" diameter wire attached to the electrode with electrical grade tin lead solder. A pull parallel to the surface of the electrode produces a break in the strands and no removal of solder or electrode surface. These tests indicate that a very good high level of adhesion has been achieved between the $PVF_2$ and the initial chromium metallization. This is the critical interface, since the subsequent interfaces are significantly stronger. The tests indicate that the bond is suitable for many applications, and superior to competitive electroding systems that have been available for test.

The method of electroding herein described may be employed with $PVF_2$, in the unoriented unpoled state; or in the oriented, but unpoled state, or in the oriented and poled state. The plasma etching steps and the sputtering processes steps may be conducted at sufficiently mild temperatures so as not to decrease the piezoelectric activity of the $PVF_2$ at any stage in the piezeoelectric activation.

What is claimed is:
1. The method of electroding a poly(vinylidene fluoride) ($PVF_2$) solid comprising the steps of:
   providing a $PVF_2$ solid containing crystallites,
   abrading the surface of the $PVF_2$ solid to provide an irregular surface,
   rinsing the surface of the $PVF_2$ solid to remove surface contaminants,
   plasma etching the surface of the $PVF_2$ solid by activated free radical and ionic species of oxygen to created temporary molecular scale surface irregularities while keeping the $PVF_2$ solid at a room temperature below the melting point of its crystallites for dimensional stability, and
   sputtering a metallic layer upon the plasma etched surface of the $PVF_2$ solid before the temperary molecular scale surface irregularities have deteriorated.
2. The method of claim 1 wherein:
   said $PVF_2$ solid contains polarized, oriented crystallites, and wherein:
   the temperature of the $PVF_2$ solid, during plasma etching, is kept below that for reversion to the unpolarized state.
3. The method of claim 2 wherein the temperature of the $PVF_2$ solid, during sputtering, is kept below that for reversion to the unpolarized state.
4. The method as set forth in claim 1 having the added step of sputter etching the surface of the $PVF_2$ solid for further removal of surface contaminants, after plasma etching and prior to sputtering said metallic layer.
5. The method of claim 4 wherein:
   the temperature of the $PVF_2$ solid, during sputter etching is kept below that for reversion to the unpolarized state.
6. The method of claim 4 wherein:
   said sputtered metallic layer includes a chromium layer applied to said plasma etched surface of the $PVF_2$ solid, said chromium being selected for optimum adhesion.
7. The method of claim 6 wherein:
   said sputtered metallic layer also includes a layer of copper sputtered upon said chromium layer to a thickness suitable for electrodeposition.
8. The method set forth in claim 7 having the added step of electrodepositing copper upon said sputtered copper layer to a thickness suitable for electroding said $PVF_2$ solid.

* * * * *